United States Patent
Barber et al.

(10) Patent No.: US 6,307,447 B1
(45) Date of Patent: Oct. 23, 2001

(54) TUNING MECHANICAL RESONATORS FOR ELECTRICAL FILTER

(75) Inventors: Bradley Paul Barber, Chatham; Yiu-Huen Wong, Summit; Peter L. Gammel, Millburn, all of NJ (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/432,040

(22) Filed: Nov. 1, 1999

(51) Int. Cl.[7] .............................. H03H 9/54; H03H 9/56; H03H 9/62; H03H 9/205; H03H 3/04
(52) U.S. Cl. .......................... 333/189; 333/191; 333/201; 29/25.35; 310/312; 310/364
(58) Field of Search ..................................... 333/187–192, 333/201; 310/312, 364; 29/25.35

(56) References Cited

U.S. PATENT DOCUMENTS

| | | | |
|---|---|---|---|
| 3,544,926 | * 12/1970 | Hurtig | 310/312 X |
| 3,549,414 | * 12/1970 | Curran et al. | 333/188 X |
| 3,760,471 | * 9/1973 | Börner | 333/191 X |
| 3,864,161 | 2/1975 | Thompson | 117/212 |
| 4,234,860 | 11/1980 | Schumacher et al. | 333/187 |
| 5,373,268 | 12/1994 | Dworsky et al. | 333/187 |
| 5,400,001 | 3/1995 | Asakawa et al. | 333/186 |
| 5,407,525 | * 4/1995 | Michel et al. | 156/627 |
| 5,662,782 | * 9/1997 | Gomi et al. | 204/192.34 |
| 5,692,279 | 12/1997 | Mang et al. | 29/25.35 |
| 5,780,713 | * 7/1998 | Ruby | 73/1.82 |
| 5,873,153 | 2/1999 | Ruby et al. | 29/25.35 |
| 5,894,647 | 4/1999 | Lakin | 29/25.35 |
| 5,910,756 | 6/1999 | Ella | 333/133 |
| 5,929,555 | 7/1999 | Sugimoto et al. | 310/360 |
| 5,933,062 | 8/1999 | Kommrusch | 333/193 |
| 6,051,907 | * 4/2000 | Ylilammi | 310/312 |

FOREIGN PATENT DOCUMENTS 9-18266  *  1/1997  (JP) .

* cited by examiner

Primary Examiner—Robert Pascal
Assistant Examiner—Barbara Summons

(57) ABSTRACT

The present invention is a method for adjusting different resonant frequencies of a plurality of mechanical resonators formed on a common substrate, in a case where the resonant frequencies of the resonators are a function of each resonator thickness. According to this method the resonators are each formed with an etchable top electrode layer which includes a material having different etching properties as a topmost layer for each of the resonators having different resonant frequencies. By selectively etching these etchable layers one at a time in the presence of the others, one may adjust the resonant frequencies of each of the resonators without need to mask the resonators during the etching process. Associated with this method there is a resonator structure having a top electrode structure having a topmost layer having different etching characteristics for different resonators.

16 Claims, 2 Drawing Sheets

TUNING MECHANICAL RESONATORS FOR ELECTRICAL FILTER

BACKGROUND OF THE INVENTION

1. Field of the Invention

This invention relates to electrical filters employing a mechanical transducer and more particularly to a method for fine tuning such filters following batch fabrication of the filters.

2. Description of Related Art

The need to reduce the cost and size of electronic equipment has led to a continuing need for ever smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filter element that meets these needs is constructed from mechanical resonators such as acoustic resonators. These devices use acoustic waves, bulk longitudinal waves for example, in thin film material, typically but not exclusively piezoelectric (PZ) material. In one simple configuration, a layer of PZ material is sandwiched between two metal electrodes. The resonator may be suspended in air, supported along its rim, or may be placed on an acoustic mirror comprised of a plurality of alternating layers of high and low acoustic impedance (the product of speed and density), usually silicon dioxide and aluminum nitride. When an electric field is applied between the two electrodes via an impressed voltage, the PZ material converts some of the electrical energy into mechanical energy in the form of sound waves. For certain crystal orientations, such as having the c axis parallel to the thickness of an Aluminum Nitride film, the sound waves propagate in the same direction as the electric field and reflect off of the electrode/air or electrode/mirror interface.

At a certain frequency which is a function of the resonator thickness the forward and returning waves add constructively to produce a mechanical resonance and because of the coupling between mechanical strain and charge produced at the surface of a piezoelectric material, the device behaves as an electronic resonator; hence, such devices combined in known architectures can act as a filter. The fundamental mechanical resonant frequency is that for which the half wavelength of the sound waves propagating in the device is equal to the total thickness of the piezoelectric plus electrode layers. Since the velocity of sound is many orders of magnitude smaller than the velocity of light, the resulting resonator can be more compact than dielectric cavity resonators. Resonators for 50 Ohm matched applications in the GHz range may be constructed with physical dimensions approximately 100 micrometers in diameter and few micrometers in thickness.

Combinations of such resonators may be used to produce complex filters for band pass applications as disclosed inter alia in U.S. Pat. No. 5,910,756 issued to Ella. This patent describes the use of multiple acoustic resonators in constructing ladder and T type band pass filters.

The resonant frequency of the resonator is a function of the acoustic path of the resonator. The acoustic path is determined by the distances between the outer surfaces of the electrodes. When batch producing resonators on a substrate, the thickness of the transducing material and the electrodes is fixed at fabrication; hence, the resultant resonance frequency is also fixed. Since there are variations in thickness from device to device resulting from manufacturing tolerances, some method for fine tuning the resonance frequency of each device is needed.

To compensate for this inability to reliably and inexpensively mass produce resonators and therefore filters with the proper resonance characteristics, it is known to intentionally produce resonators having a lesser thickness than the thickness indicated to achieve a desirable resonant frequency, and then deposit excess material on at least one of the electrodes to change the overall thickness of the device and thereby fine tune the device. As this deposition of material may be done while the device is subjected to an input signal and simultaneously tested for resonance this method has produced acceptable results.

This method is not, however without problems as the presence of a mask needed to control the deposition over the desired electrodes creates problems of its own. If the mask, for instance is in contact with the electrode, the mask mass is added to the device mass and alters the resonance characteristics of the device. On the other hand if the mask is not in contact with the device the control of the deposition area suffers. Such masking techniques have been successful with quartz type resonators that are much larger, but have not been as successful with resonators of the order of less than one millimeter.

It has also been proposed to remove material from the device in order to adjust its resonant frequency.

Whether deposition or removal of electrode material is used in fine tuning a resonator, in producing a filter that uses more than one resonator as is the typical case, more than one resonator frequency must be adjusted and that involves a multiplicity of steps wherein each resonator is masked and fine tuned in separate process steps.

There is thus still a need for a process to fine tune more than one resonator to different desired frequencies without need to move and re-mask the resonators.

SUMMARY OF THE INVENTION

The above object is obtained in accordance with this invention by a method for adjusting different resonant frequencies of a plurality of mechanical resonators formed on a common substrate, wherein the resonant frequencies of said resonators are a function of each resonator thickness, the method comprising forming said resonators with an etchable layer comprising a material having different etching properties for each of said resonators having different resonant frequencies and selectively etching said etchable layers to adjust the resonant frequencies of said resonators.

The terms different etching properties and selective etching as used herein mean that the materials used may be etched using an etching process for one that does not effect the other, or that effects the other at a different rate so that one material can be etched for the purpose of this invention while both are exposed to the same etching process without effecting the other, or effecting the other to a degree that does not interfere with the purpose of this invention. Thus selective etching is the process of subjecting two or more materials to an etching process that effects only one of the materials, or that effects one of the materials differently, i.e. at a different rate, than the others.

In somewhat more detail, the method comprises adjusting the resonant frequencies of at least two mechanical resonators comprising a filter, to a first and a second desired frequency. Each of the resonators comprises a mechanical energy transducer between a top and a bottom electrode, and its resonant frequency is a function of the overall resonator thickness. The frequency adjustment comprises the following process:

Forming the top electrode over the transducer material for each of the resonators, having a thickness selected such that the combined bottom electrode thickness, transducer thickness and top electrode thickness is in excess of the required total thickness for each resonator to resonate at a desired frequency.

The top electrode of the first resonator comprises a first material and the top electrode for the second resonator comprises a second material. These materials are selected to have different etching properties, that is each is etched by a different etchant that does not effect the other.

The process next comprises selectively etching the top electrodes of the first and second resonators while applying a signal and monitoring each of the resonator frequencies, and stopping the etching process for each of resonators when the monitored resonant frequency is the desired resonant frequency for each resonator. Thus there is no need to either move or mask the resonators during the frequency adjusting process where more than one resonator on a common support must be adjusted, each to a different frequency.

Alternatively, the method further includes forming the top electrode of at least one resonator by first forming a first conductive layer over the film of transducer material and subsequently adding a topmost adjustment layer over the first conductive layer. The topmost adjustment layer is selected to have different etching properties than the top electrode of the other resonators. For instance, the adjustment topmost layer of one top electrode can be $SiO_2$ placed over an aluminum conductive layer, and the top electrode of another resonator simply an Aluminum conductive layer. In the alternative all electrodes may be metals such as gold for one, aluminum for another, titanium for a third and so on.

In a typical single T-cell filter structure there are three resonators two of which have substantially the same frequency, the third being different. In this case the same material, i.e. aluminum, may be used for the two same resonant frequency resonators and a second material, such as gold for the third. In the alternative, aluminum may be used as a conductive electrode layer in all three resonators and a silicon dioxide ($SiO_2$)layer may be added to the aluminum electrode of one of the resonators to alter its thickness. Fine tuning may then be accomplished according to the present invention for two different frequencies, by reactive ion etching of the aluminum electrodes with chlorine ions and by reactive ion etching of the $SiO_2$ topmost layer of the third resonator top electrode with fluorine ions.

BRIEF DESCRIPTION OF THE DRAWINGS

The invention can be more fully understood from the following description thereof in connection with the accompanying drawings described as follows.

DESCRIPTION OF THE PREFERRED EMBODIMENT(S)

Figure 1:
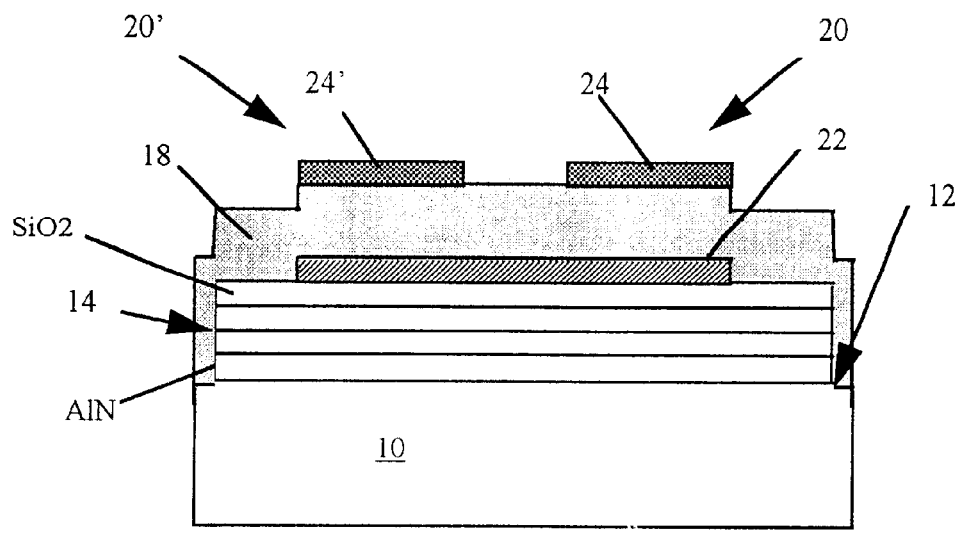
FIG. 1 shows a typical cross section of a resonator comprising an acoustic mirror and a piezoelectric resonator.

Throughout the following detailed description, similar reference characters refer to similar elements in all figures of the drawings. Depending on the thin film materials used, additional layers of insulation, protective films, encapsulation, etc. may be required and all such layers and films have been omitted herein for simplification and better understanding of the invention. The specific structure and fabrication method illustrated is for exemplary purposes only and other methods of fabricating a resonator and or filter in accordance with the present invention can be devised including but not limited to substrate etching, adjustment layers, reflecting impedance matching layers, etc. U.S. Pat. No. 5,373,268, issued Dec. 13, 1994, with the title "Thin Film Resonator Having Stacked Acoustic Reflecting Impedance Matching Layers and Method", discloses a method of fabricating thin film resonators on a substrate.

Referring now to FIG. 1, there is shown a typical structure of two mechanical resonators 20 and 20' on a common support of the type used in forming an electrical filter. The resonator structure comprises a substrate 10 having an upper planar surface 12. Substrate 10 can be any convenient material that is easily workable, e.g. any of the well known semiconductor materials. In the present specific example, substrate 10 is a silicon wafer normally used for fabricating semiconductor products. Other materials useful as resonator supports include, inter alia, glass, quartz, sapphire or high resistivity silicon In the example illustrated in FIG. 1, a plurality of alternating layers of SiO2 and AlN, ending with a SiO2 uppermost layer, form an acoustic reflective mirror 14. Each of the mirror layers has a typical thickness that is a ¼ wavelength of the filter's central frequency. For PCS cellular phone applications this frequency is 1.9 gigahertz.

The use of an acoustic mirror of course, is not the only way to make a resonator. What is needed, and what the acoustic mirror provides, is good acoustic reflection at the boundaries of the transducer layer. Other techniques to achieve this are known in the art, including using a solid to air interface. Air against most solids produces the required acoustic reflection. For example, one can also make an acoustic resonator by thin film deposition of the resonator material on a substrate of Si and subsequent removal of the layers beneath the resonator by: a) back etching away the Si or b) deposition of a sacrificial layer beneath the resonator which is removed by subsequent preferential etching. The present invention is directed to resonator tuning by selective etching techniques, and applies to all resonators regardless of their structure.

A bottom electrode, which may be patterned to define distinct electrodes for each resonator structure, (not shown) or may be a common bottom electrode 22 (shown in FIG. 1) is deposited and patterned (if required) on the surface of the acoustic mirror. A mechanical transducer layer 18, such as a piezoelectric layer, is next coated over the bottom electrode. In most applications, the piezoelectric layer is coated as a continuous conforming layer over the bottom electrodes, the acoustical mirror, if present, and the support.

Top electrodes 24 and 24' complete the basic resonator structure. The term electrode as used in this description denotes both single conductive layer electrodes and/or electrodes comprising more than one layer at least one of which is conductive.

The manner of fabrication of the above described layers and resonator structure is well known in the resonator fabrication art. The different layers can for example be fabricated utilizing any of the well known techniques, such as, vacuum deposition of a convenient material, electroless deposition, etc., followed by masking and etching to created desired patterns. In FIG. 1, the transducer layer 18 is shown as a continuous layer, however this layer may, depending on the particular application, be masked and etched so that it exists only between the top and bottom electrode defined areas.

Still as shown in FIG. 1, a plurality of individual piezoelectric resonators are fabricated on a single wafer and, since each resonator is relatively small (on the order of a few hundred microns on each side) and the plurality of resonators are formed close together, each resonator will be very similar to each adjacent resonator. A required number of piezoelectric resonators are fabricated on a single substrate or wafer and electrically connected to form a desired piezoelectric filter configuration. The electrical connections are typically patterned on the wafer at the same time that electrodes 22, 24 and 24' are patterned on the wafer.

Because piezoelectric materials are the most commonly used transducer materials, we describe this invention using a piezoelectric material for the transducer. Such use is not, however, intended to limit the invention to piezoelectric transducers. Other transducers such a magnetostrictive or electrostrictive may equally well be used in filter designs and the teachings of this invention apply equally well to structures that incorporate different transducer materials. What is significant is that the transducer material used results in a resonator having a resonant frequency that is dependent on the overall thickness of the resonator, which thickness includes both the transducer thickness and the electrode thickness.

Figure 2:
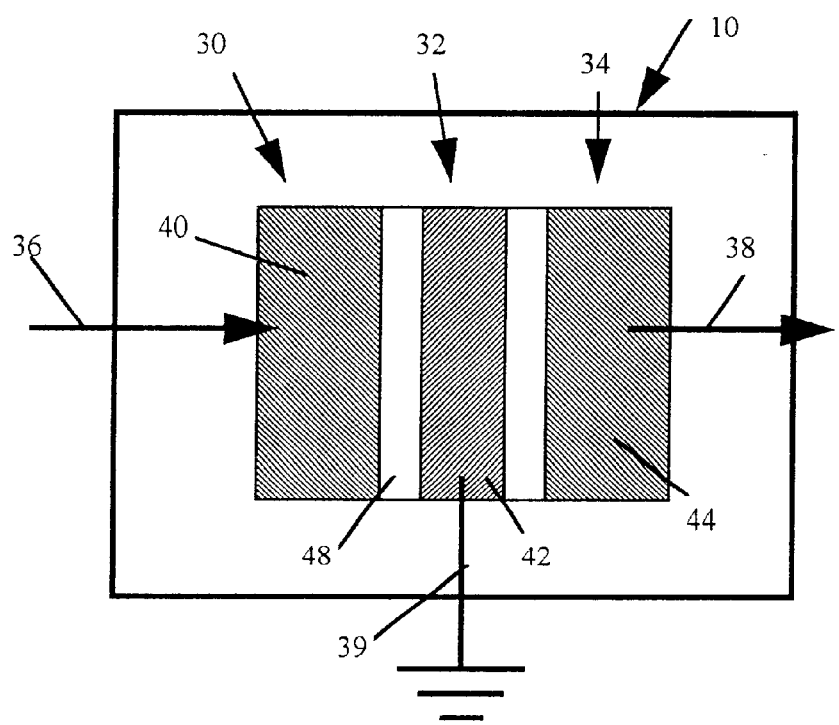
FIG. 2 shows a top view of a three resonator structure forming a single T-cell band pass filter.

FIG. 2 is a top view of a basic T-cell type filter structure utilizing three resonators, 30, 32, and 34. A three resonator T-cell filter structure is a simple case used for illustrating the present invention. Other, more complex designs are also well known in the art. Frequently, many T-cells are concatenated to form more complex filters. There are also lattice filters, and "L" filters. The present invention is applicable in all cases, and is not limited to T-cells.

In cases where there are more than two resonators present in a filter structure, there may be more that two resonant frequencies to which resonators must be tuned. The use of selective etching according to the present invention is therefore not limited to two resonant frequencies. The two frequencies discussed herein are used only to illustrate this invention.

Each resonator in FIG. 2 has the structure of the resonators shown in FIG. 1. A T-cell filter structure can thus be achieved by providing through wire 36 an input connection to the resonator 30, and through wire 38 an output. The shunt resonator 32 is connected to common or ground through wire 39. Bottom electrode 22 serves as the common point between all resonators. In this example, resonators 30 and 34 are designed to have the same resonant frequency while resonator 32 has a different resonant frequency. To obtain this difference in frequency the total electrode/transducer combined thickness is the same for resonators 30 and 34 but different (higher for bandpass filters) for resonator 32.

In order to facilitate the batch manufacture of the resonators, it is advantageous to initially form the bottom electrode and the piezoelectric layer with the same thickness for all three resonators and vary their resonant frequencies by varying the thickness of the top electrodes 40, 42 and 44. In this example electrodes 40 and 44 have the same thickness while electrode 42 has a different thickness.

Figure 3:
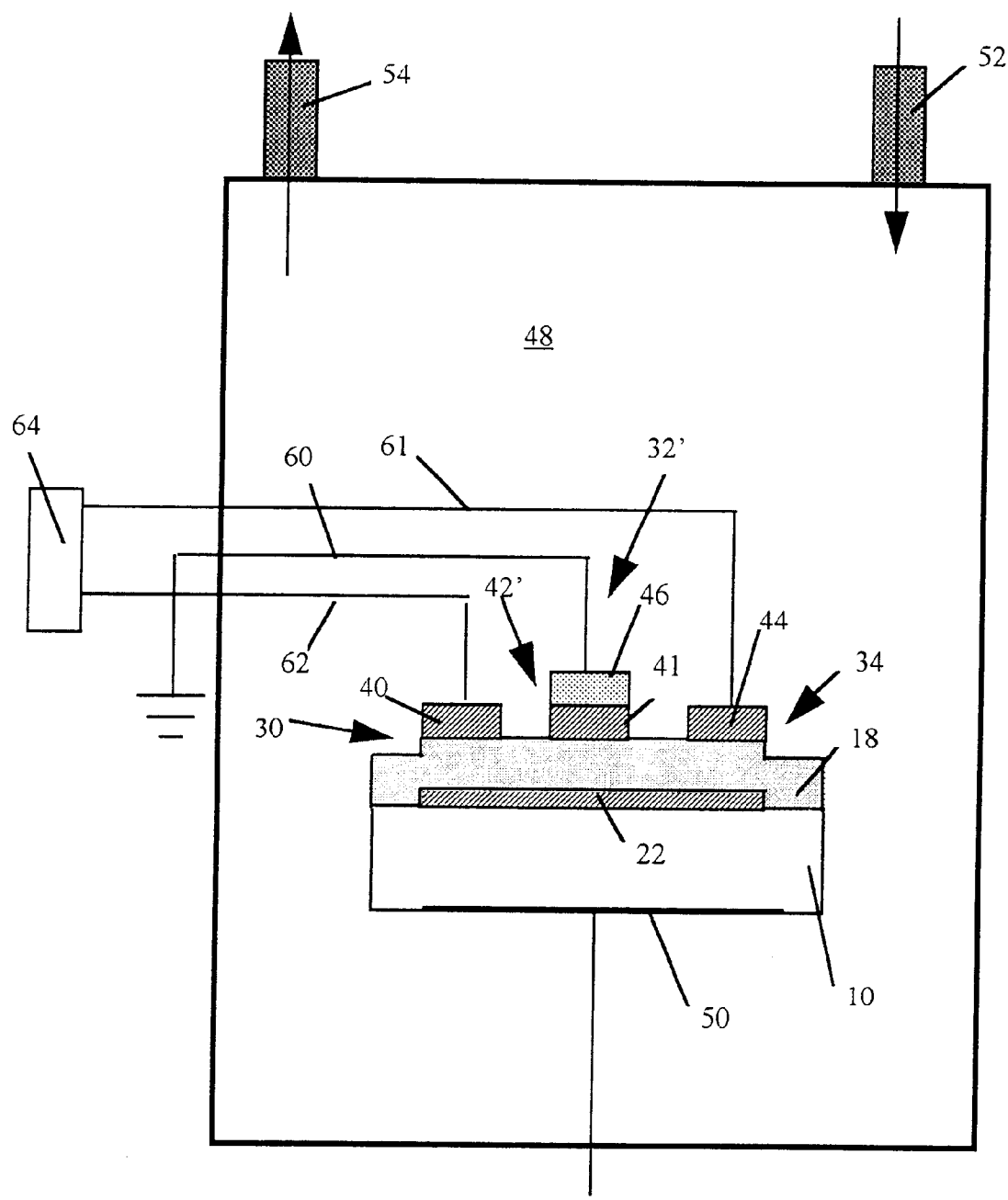
FIG. 3 shows a typical arrangement for selective etching using a reactive ion etching process.

FIG. 3, illustrates the selective etching process according to the present invention as applied to produce the three resonator T-cell filter structure of FIG. 2. For illustration purpose the filter structure shown is a simplified cross section of such structure. The acoustic mirror is not illustrated because its presence is not essential in explaining this invention. The person skilled in the art will recognize that the resonators may be substantially more complex than illustrated, however the structure as represented is sufficient to explain the invention, any omitted features such as details of the resonator supports, connections, protective layers etc. being well known in the art as previously mentioned.

According to the present invention a different material is used for the top electrodes, or for the uppermost portion of the top electrodes, for each resonator having a desired different resonant frequency. In the simplest case different metals are used for each electrode but the desired effect of selective etching can also be achieved by making all electrodes from the same material then adding a second layer, conducting or non-conducting, to the top electrode of the resonator desired to function at a lower frequency. FIG. 3 illustrates this composite electrode case.

This approach is advantageous as it permits a manufacturing process where a uniform thickness single conductive layer is deposited over the transducer layer. The conductive layer is next patterned to produce conductive layers 40, 41 and 44. Layers 40 and 44 serve as top electrodes for two of the resonators. Next an added layer 46 is deposited and patterned leaving additional material only over the corresponding top conductive layer of the resonator meant to have a lower frequency using a material that has different etching properties from the material used for the conductive electrode layers 40, and 44. Such material may be a conductive layer of a different metal or a non conductive material.

In this example, the top electrodes 40 and 44 for resonators 30 and 34 respectively, are formed by an aluminum layer, while the top electrode 42' of resonator 32' is a combination of an aluminum layer 41 and a superposed $SiO_2$ layer 46 which is, preferably, co-extensive with the aluminum layer. This $SiO_2$ layer serves as an adjustment layer which may be etched to adjust the resonant frequency of this resonator. If the topmost electrode 46 of a resonator is non-conducting such as the case of SiO2, a small exposed region of layer 41 must be provided to which connection 60 must be made for good electrical contact (not shown in FIG. 3). For better performance this electrical connection can be made just outside the edge of the resonator by leaving a small region of electrode 41 outside of the boundary of bottom electrode 22 on top of which no electrode 46 remains after device preparation.

In this manner the top conductive layer may deposited in a single step over all resonators then patterned and additional material deposited only over the patterned conductive layer forming the top electrodes of selected resonators.

The support with the resonators is next placed in a vacuum chamber 48 for reactive ion etching. Typically such chamber comprises as a minimum, an article support 50 connected to a high voltage source (not shown), an exhaust port 54 and a gas intake port 52. Test and measurement connections 60, 61 and 62 to the resonators of a sample are also provided whereby a test signal may be selectively applied to each resonator to monitor the resonator resonant frequency during the etching process. A vector network analyzer (VNA) 64 can be used to measure the filter's response. Known de-embedding techniques can be used to extract responses of the individual resonators. See for example Pozar, *Microwave Engineering*, Addison-Wesley, Reading, Mass., 1990.

Connecting to the proper resonator in the simple example illustrated in FIG. 3 is of course easy. The filter input, output and ground connections are conveniently available for testing connections. In complex structures with filters having a plurality of interconnected resonators such easy access may not always be available. In such cases simple small diagnostic resonators may be constructed adjacent to and simultaneously with the actual filter resonators and these diagnostic resonators can be used to monitor the etching process. Since these diagnostic resonators are constructed same as the actual filter resonators and are etched simultaneously with the filter resonators, both will end up with the same frequency during the etching process. Thus they provide a convenient way to monitor the tuning of the actual filter resonators without access to the filter resonators.

In a filter that comprises a plurality of resonators, such as the three resonator T-cell filter shown in FIGS. 2 and 3, the top electrode of the shunt resonator that is shown comprising an adjustment SiO2 layer may be etched first using fluorine ions while the resonator is excited and its resonant frequency monitored. When the proper thickness of the top electrode has been reduced by sufficient etching of the adjustment SiO2 layer to obtain the desired resonant frequency, the etching process is stopped and the fluorine evacuated from the vacuum chamber. Chlorine is next introduced in the chamber and etching of the aluminum electrodes begins without need to mask or move the sample in the vacuum chamber. A test signal is now applied to these resonators and when the resonant frequency is reached for the resonators with the aluminum top electrode, the etching process is terminated. Thus both resonators have been adjusted to proper different frequencies with high accuracy and without need to mask or move the sample during the process.

Alternatively, the three resonators may be fabricated with the top electrodes 40 and 44 out of aluminum and the top electrode 42 out of gold. Aluminum and gold are etched in different etchants, therefore pairing aluminum and gold for the top electrodes allows the eventual selective etching of each electrode to obtain the necessary frequency adjustment for each resonator.

Removal of excess electrode thickness is done by etching the excess material from the top electrodes, preferably by dry etching as described above. However, selective etching may also be accomplished using RIE with gasses that may etch both top electrode materials in combination with gasses that etch top electrode materials selectively. For example, argon gas under high voltage etches everything simply by mechanical process. Chlorine, on the other hand will not etch Gold as fast as Aluminum if at all. One can thus use the nonselective argon gas to etch all resonators until one subset of resonators, those having gold as the top electrode, are at their proper frequency leaving the others, with aluminum top electrodes still below their desired frequencies. Then use chlorine gas to etch the aluminum top electrodes of the remaining subset of the resonators to tuning them to their desired resonant frequency.

Reactive ion etching is preferred because it permits the simultaneous testing of the resonator while it is being etched. However other etching techniques can be applied within the scope of this invention.

Wet etching by dipping the parts in solution offers the advantage of speed and can also be used to practice this invention. In such case, a measurement of the resonator frequency is made prior to dipping the resonator in an etching bath. A subsequent timed immersion removes desired amounts of material. For example, in a structure with three resonators where three different resonant frequencies are desired, the top electrodes (or the topmost layer of the top electrodes) of the three resonators may be respectively titanium, gold and aluminum. The baths then may be EDTA Peroxide to etch the titanium, PAE etch for the aluminum, and potassium iodide/iodine for the gold electrode.

The disadvantage of wet etching is that frequency testing during the etching process is impractical because the liquid will damp the sound in the resonator.

Vapor phase etch is another possible process and tools exist and can be used. Similar chemistry to the wet etch example above can be used, and in this case active measurement of the resonant frequencies may be done concurrent with the etching process without loading the resonator. A vapor phase etching apparatus resembles an RIE chamber in that it has gas handling and vacuum inputs and outlets to introduce chemical vapor and pump away the by products, but does not include a plasma source. An advantage to vapor phase over RIE is etch speed.

Etching is well known technology not requiring further discussion herein, as shown by the following two treatises: Vossen and Kern, *Thin film processes*; Academic Press, San Diego 1978 and by the same authors, *Thin film processes II*, Academic Press, San Diego 1991.

There is no preferred way to conduct the selective etching that is applicable in all instances. In the worst case each resonator may have to be tuned separately. However if production uniformity and repeatability are adequate then a global or regional tuning of resonators in wafers or parts of wafers may be done at a reduced cost. Depending on manufacturing, cost, precision required, etc. a hierarchy of tuning strategies that takes advantage of the ability to selectively etch certain electrodes in certain resonators can be employed.

The invention has heretofore been described with reference to specific materials and etching processes. Such description is only for the purpose of explaining our invention and the person skilled in the art will recognize that there are alternate ways to practice this invention. As discussed briefly, the etching process differential may be one of rate of removal of material in which case such rate difference may be used to remove sufficient material from one resonator to achieve the desired resonant frequency while removing less material from the other again also achieving the desired frequency for the second resonator.

Such modifications are to be construed as being encompassed within the scope of the present invention as set forth in the appended claims wherein we claim:

1. A method for adjusting different resonant frequencies of a plurality of mechanical resonators formed on a common substrate, wherein the resonant frequencies of said resonators are a function of each resonator thickness, the method comprising forming said resonators with an etchable layer comprising a material having different etching properties for each of said resonators having different resonant frequencies and selectively etching said etchable layers to adjust the resonant frequencies of said resonators.

2. A method for adjusting a resonant frequency of at least a first and a second mechanical resonator comprising elements of an electrical filter, each of said resonators comprising a mechanical energy transducer between a top and a bottom electrode, wherein the resonant frequency of each resonator is a function of an overall resonator thickness, the method comprising:

a) forming the top electrode for each resonator having a top electrode thickness selected such that the resonator thickness is in excess of the required total thickness for each resonator to resonate at a desired frequency, wherein the top electrode of the first resonator comprises a first material and the top electrode for the second resonator comprises a second material, and wherein said first and said second materials have different etching properties;

b) selectively etching said top electrodes of said first and second resonators; and c) stopping the etching process for each of said first and second resonators when the resonator thickness produces the desired frequency for said resonator.

3. The method according to claim 2 wherein the step of forming said top electrodes further comprises forming the top electrode of the first resonator by first forming a first conductive layer over said transducer and forming a topmost adjustment layer over said first conductive layer, the topmost adjustment layer selected to have different etching properties than a topmost layer of the top electrode of the second resonator.

4. The method according to claim 3 wherein said topmost layer of said first top electrode is $SiO_2$ and the top electrode of the second resonator is an aluminum layer.

5. The method according to claim 2 wherein one of said top electrodes comprises a gold layer and the other a aluminum layer.

6. The method according to claim 2 wherein the selective etching is done while applying an electrical signal and monitoring each of said resonator frequencies.

7. The method according to claim 6 wherein the etching process comprises reactive ion etching.

8. The method according to claim 6 wherein the etching process comprises vapor phase etching.

9. The method according to claim 6 wherein at least one diagnostic resonator having a resonant frequency same as the resonant frequency of one of said first and second resonators, is built adjacent one of said first and second mechanical resonators comprising the elements of the electrical filter, and wherein the selective etching is done in the presence of said diagnostic resonator while applying an electrical signal and monitoring said diagnostic resonator frequency.

10. The method according to claim 2 wherein the transducer material is selected from the group consisting of piezoelectric, piezomagnetic, electrostrictive and magnetostrictive materials.

11. The method according to claim 2 wherein the bottom electrode is formed as a common electrode to both the first and the second resonators.

12. The method according to claim 2 wherein the selective etching comprises dipping the resonators in an etching solution for a period of time calculated to remove a sufficient amount of top electrode material of at least one of said resonators' top electrode to produce a desired resonant frequency.

13. An electrical filter comprising at least a first and a second mechanical resonators each having a distinct resonant frequency, each of said resonators comprising a mechanical energy transducer between a top and a bottom electrode, each of the resonators having a thickness, the resonant frequency of each of said resonators being a function of each resonator thickness, the first of said resonators having its top electrode comprising a material having etching properties different from the top electrode of said second resonator, each of said resonators having been etched to its respective thickness.

14. An electrical filter comprising at least a first and a second mechanical resonators each having a distinct resonant frequency, each of said resonators comprising a mechanical energy transducer between a top and a bottom electrode, each of the resonators having a thickness, the resonant frequency of each of said resonators being a function of each resonator thickness, the first of said resonators having its top electrode comprising a material having etching properties different from the top electrode of said second resonator, wherein the resonant frequency of said resonators of said filter have been adjusted by a process comprising:

selectively etching said top electrodes of said first and second resonators; and stopping the etching process for each of said first and second resonators when the frequency is the desired frequency for said resonator.

15. The electrical filter according to claim 14 wherein the top electrode of the first resonator comprises a first conductive electrode layer formed over said transducer and a topmost adjustment layer formed over said first conductive electrode, the topmost adjustment layer having different etching properties than a topmost layer of the second resonator.

16. The electrical filter according to claim 15 wherein said topmost layer of said first top electrode comprises $SiO_2$ and the top electrode of the second resonator comprises an aluminum layer.

* * * * *